(12) United States Patent
Kim et al.

(10) Patent No.: US 6,624,054 B1
(45) Date of Patent: Sep. 23, 2003

(54) MULTI-LAYER STRUCTURE FOR REDUCING CAPACITANCE AND MANUFACTURING METHOD THEREOF

(75) Inventors: Yu-Sik Kim, Seoul (KR); Joong-Hee Lee, Kyonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/224,933

(22) Filed: Aug. 21, 2002

(30) Foreign Application Priority Data

Mar. 5, 2002 (KR) ........................... 2002-11495

(51) Int. Cl.[7] ............................................. H01L 21/20
(52) U.S. Cl. ...................... 438/584; 438/669; 438/670; 438/719
(58) Field of Search ................... 438/584, 723, 438/719, 669, 670; 216/79, 80

(56) References Cited

U.S. PATENT DOCUMENTS 5,001,085 A * 3/1991 Cathey et al. ............... 438/671
5,053,105 A * 10/1991 Fox, III ....................... 156/643
6,156,485 A * 12/2000 Tang et al. .................. 430/313
6,268,287 B1 * 7/2001 Young et al. ................ 438/671

OTHER PUBLICATIONS

Wolf, S., et al., Silicon Processing for the VLSI Era, vol. 1, 1986, Lattice Press, pp. 534–536.*

* cited by examiner

Primary Examiner—T. N. Quach
(74) Attorney, Agent, or Firm—Cha & Reiter

(57) ABSTRACT

The invention relates to a multi-layer structure used in an optical communication field and its manufacturing method in which the capacitance effect between the metal patterns of a Silicon Optical Bench (SiOB) is significantly reduced. The multi-layer structure includes a dielectric layer and conductive patterns on a semiconductor substrate, such that the conductive patterns are separated from each other, wherein the dielectric layer and upper portions of the semiconductor substrate between the conductive patterns are etched out to a predetermined thickness to effectively reduce the capacitance without changing the area or structure of the metal patterns.

8 Claims, 6 Drawing Sheets

MULTI-LAYER STRUCTURE FOR REDUCING CAPACITANCE AND MANUFACTURING METHOD THEREOF

CLAIM OF PRIORITY

This application makes reference to and claims all benefits accruing under 35 U.S.C. Section 119 from an application entitled, "MULTI-LAYER STRUCTURE FOR REDUCTION OF CAPACITANCE AND METHOD FOR MANUFACTURING THE SAME," filed in the Korean Intellectual Property Office on Mar. 5, 2002 and there duly assigned Serial No. 2002-11495.

BACKGROUND OF THE INVENTION

1. Field of the Invention

The present invention relates to a multi-layer structure for reducing capacitance and a manufacturing method thereof, in particular, for reducing capacitance between metal patterns of a Silicon Optical Bench (SiOB), which is used in optical communication applications.

2. Description of the Related Art

As one skilled in the art can appreciate, a laser-diode chip and a photo-diode chip are used as a Transceiver (Tx) and a Receiver (Rx) of optical subscriber elements, respectively, in which a Silicon Optical Bench (SiOB) is deployed to connect these chips as a single module. In manufacturing this type of SiOB, the magnitude of capacitance plays an important role as the capacitance is enlarged and the frequency performance is degraded, thereby preventing the module from performing at high speed.

FIG. 1 is a sectional view illustrating a bench structure used for manufacturing an optical bench, such as SiOB, in which a SiN or $SiO_2$ dielectric film 2, and metal patterns 4 and 4' are formed on a silicon substrate 1. FIG. 2 illustrates a circuit diagram equivalent to FIG. 1, in which a section marked by a circle, i.e., a capacitance CS, an inductance LS, or a resistance RS, between the metal patterns 4 and 4', represents similar components served by the dielectric film and the silicon substrate between the metal patterns. Note that this type of structure increases the capacitance.

In order to reduce the capacitance between the metal patterns 4 and 4' in the above conventional structure, the resistance of silicon is raised, the thickness of the dielectric film is increased, and the area of the metal patterns is reduced.

However, the first method of raising the resistance of silicon requires cost increase due to delicate techniques in a silicon-wafer fabricating process. In the second method of thickening the dielectric film, the desired thickness of deposition is hard to obtain due to the limited Chemical Vapor Deposition (CVD), such as Plasma Enhanced Chemical Vapor Deposition (PECVD) or Low Pressure Chemical Vapor Deposition (LPCVD). Although the thickness can be increased if the thermal-oxidation deposition technique is employed in the second method, the deposition time is undesirably long. Lastly, the third method of reducing the area of the metal patterns has drawbacks with a limit on how much to decrease the metal pattern area due to physical and structural constraints.

SUMMARY OF THE INVENTION

Accordingly, the present invention overcomes the above-described problems and provides additional advantages, by providing a manufacturing method and a multi-layer structure for reducing capacitance, in which the capacitance can be effectively reduced without changing the area or structure of metal patterns.

According to one aspect of the invention, the multi-layer structure includes a dielectric layer and conductive patterns on a semiconductor substrate, wherein the conductive patterns are separated from each other, and wherein the dielectric layer and upper portions of the semiconductor substrate between the conductive patterns are etched out to a predetermined thickness.

Preferably, the etched-out portions of the silicon substrate between the conductive patterns have a thickness of 0.5–2 $\mu$m.

Preferably, the dielectric layer is a $SiO_2$ layer.

According to another aspect of the invention, a method of manufacturing a multi-layer structure is provided, as well, as a method comprising the following steps: (a) forming a dielectric layer on a silicon substrate; (b) forming metal patterns separate from each other on the dielectric layer to expose portions of the dielectric layer underlying the metal patterns; and, (c) etching the exposed portions of the dielectric layer and upper portions of the underlying silicon substrate between the metal patterns to a predetermined thickness.

Preferably, the (b) step comprises the steps of carrying out lift-off photolithography to form lift-off photo-sensitive patterns on the dielectric layer except for areas for forming the metal patterns; depositing metal over the entire structure; and, removing the photosensitive patterns and metal deposited on the photosensitive patterns via a lift-off process to form metal patterns.

Preferably, the (c) step of etching the exposed portions of the dielectric layer and upper portions of the underlying silicon substrate between the metal patterns for a certain thickness comprises the step of dry-etching the exposed underlying dielectric layer and subsequently over-etching to remove the upper portions of the underlying silicon substrate by using the metal patterns as an etching mask.

BRIEF DESCRIPTION OF THE DRAWINGS

The above features and other advantages of the present invention will be understood more clearly from the following detailed description taken in conjunction with the accompanying drawings, in which.

DETAILED DESCRIPTION OF THE PREFERRED EMBODIMENT

Figure 1:
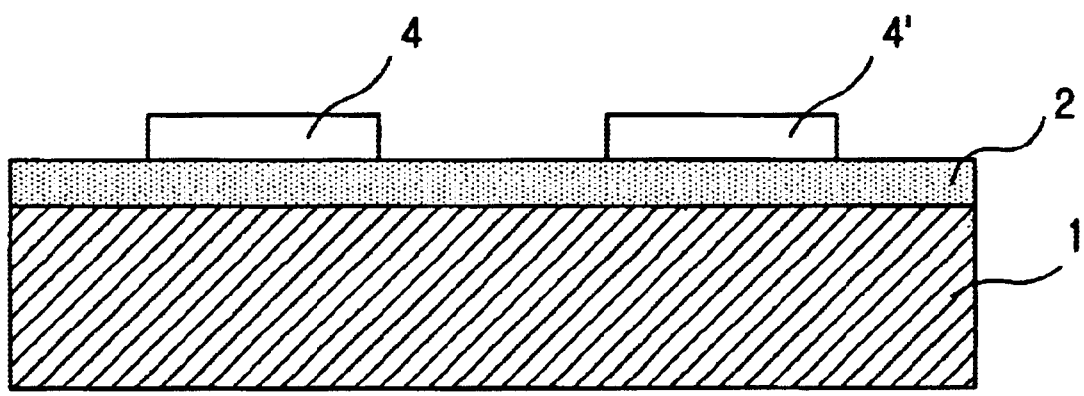
FIG. 1 is a sectional view illustrating a bench structure for manufacture of an optical bench of the related art.

The following detailed description will disclose a preferred embodiment of the present invention in reference to FIGS. 3, 4, and 5A–5C, in which the same reference numerals are used throughout the different drawings to designate the same or similar components. For the purposes of clarity and simplicity, well-known functions or constructions will not be described in detail as they would unnecessarily obscure the understanding of the invention.

Figure 3:
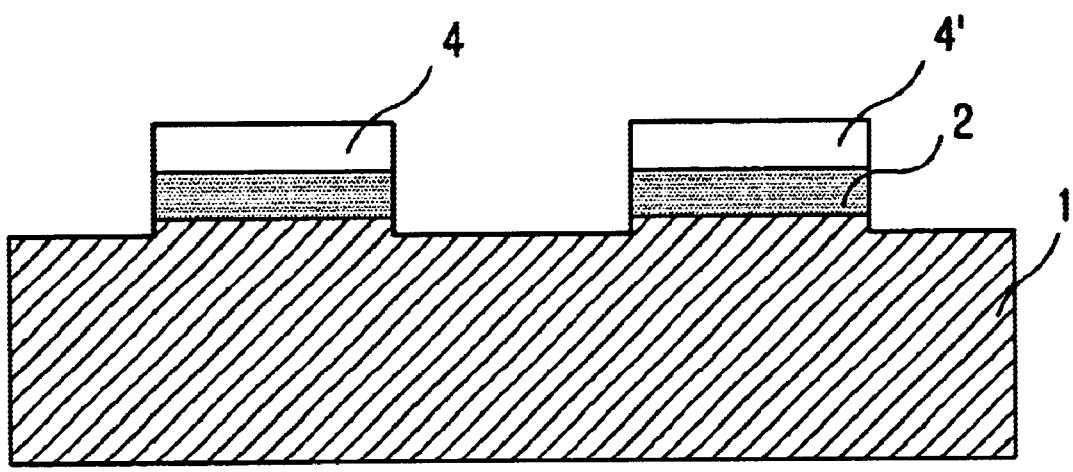
FIG. 3 is a sectional view illustrating a bench structure for manufacture of an optical bench according to an embodiment of the invention.

FIG. 3 is a sectional view illustrating an optical bench structure according to the embodiment of the present invention, in which an $SiO_2$ dielectric film 2 and metal patterns 4 and 4' are formed on a silicon substrate 1; then the $SiO_2$ dielectric film 2 and the silicon substrate 1 are partially removed through the etching process between the metal patterns 4 and 4'.

Figure 4:
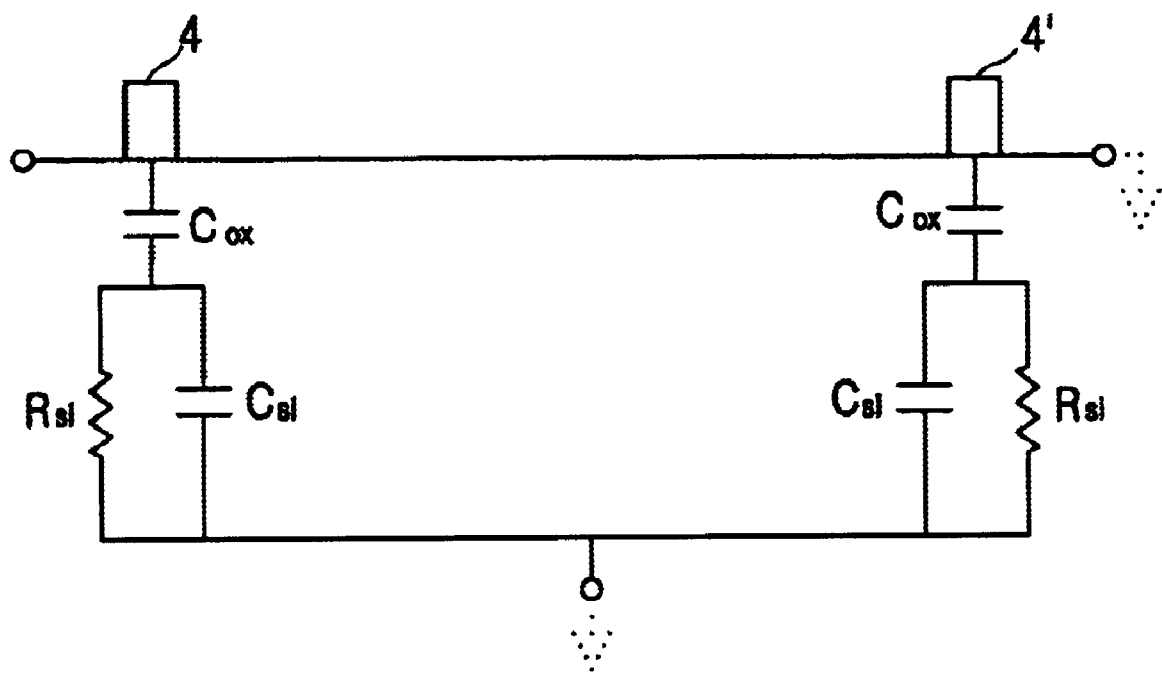
FIG. 4 is an equivalent circuit diagram of FIG. 3.

FIG. 4 depicts an equivalent circuit diagram of FIG. 3. Contrast to FIG. 2, the section marked by the circle, i.e., a capacitance CS, an inductance LS, or a resistance RS, between the metal patterns 4 and 4' is removed due to the inventive structure. As a result, the capacitance between the metal patterns 4 and 4' is reduced.

Figure 5A:
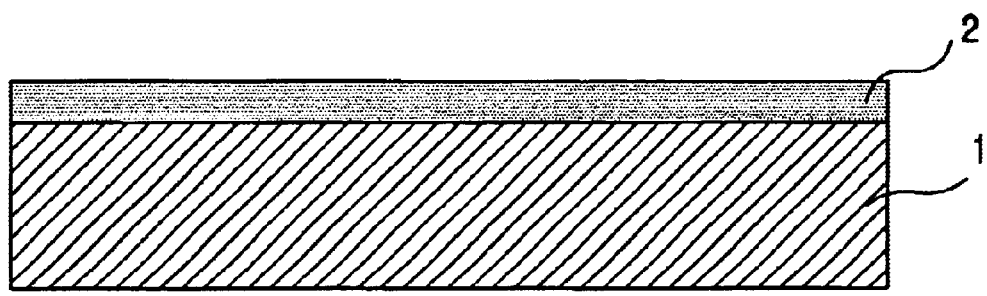
FIGS. 5A–5D are sectional views illustrating a partial process for manufacturing the optical bench according to an embodiment of the present invention.

FIGS. 5A–5D illustrate sequential sectional views illustrating the process of manufacturing the optical bench according to a preferred embodiment of the invention. First, as shown in FIG. 5A, a $SiO_2$ dielectric film 2 is deposited on a silicon substrate 1 using a Plasma Enhanced Chemical Vapor Deposition (PECVD), a Low Pressure Chemical Vapor Deposition (LPCVD), thermal oxidation deposition techniques, and other conventional methods known to those skilled in this art. Note that the $SiO_2$ film used as the dielectric film can reduce the capacitance in half as the dielectric constant $SiO_2$ film is about half that of a conventional SiNX film.

Figure 5B:
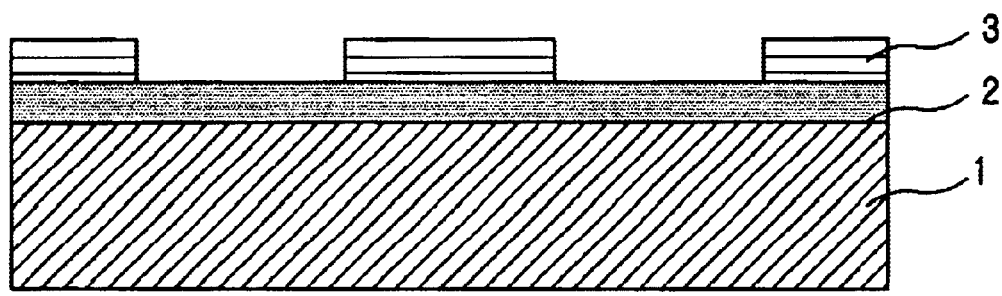
Figure 5C:
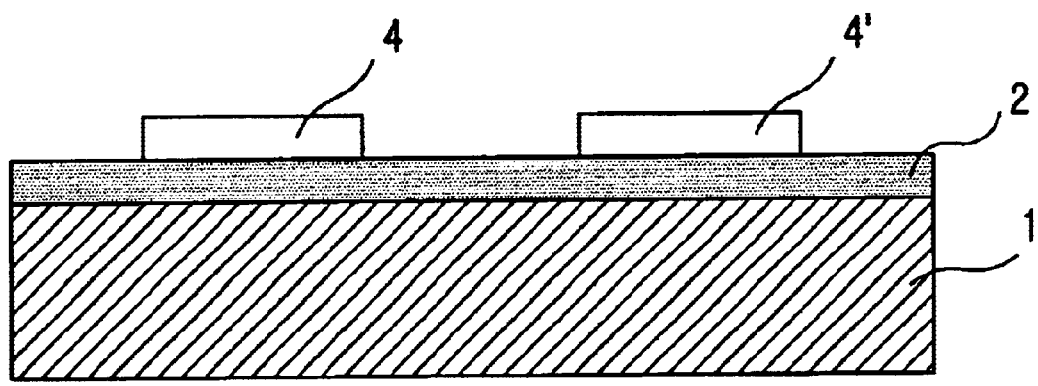

Then, as shown in FIG. 5B, a lift-off photolithography is carried out to form lift-off photosensitive film patterns 3 on the $SiO_2$ film 2 except in the areas for forming metal patterns. The necessary metal is deposited over the entire structure, and then a portion of metal deposited on the photosensitive patterns 3 is removed via a lift-off process to form the metal patterns 4 and 4' as shown in FIG. 5C.

Figure 5D:
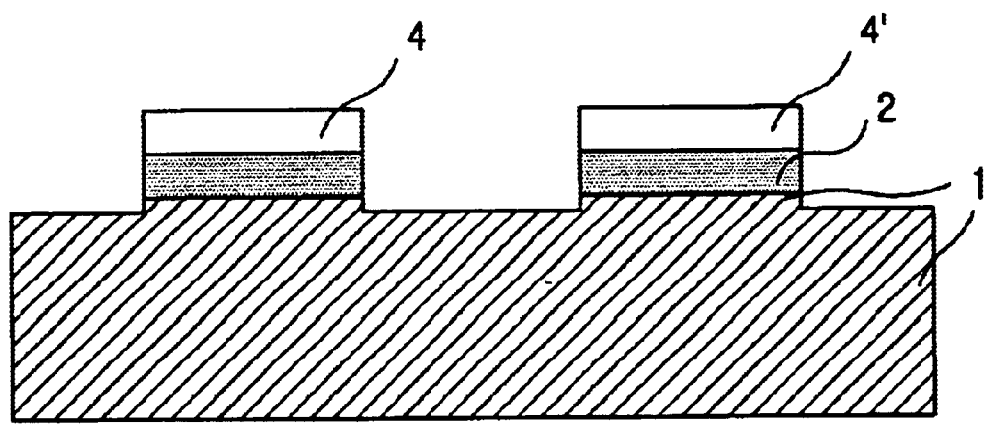

Finally, as shown in FIG. 5D, by using the metal patterns 4 and 4' as an etching mask, the exposed $SiO_2$ film 2 is dry-etched, and then over-etching is subsequently carried out to etch the upper portions of the silicon substrate 1 for 1–1.51 $\mu$m. In this case, the thickness of etching in the silicon substrate is determined to the degree of over-etching. That is, the capacitance between the metal patterns is determined according to the thickness of the silicon substrate to be etched. When the silicon substrate is etched to 1–1.5 $\mu$m, the capacitance between the metal patterns is reduced to about 1/40 compared to a conventional multi-layer structure.

Though not shown, after shallowly etching the upper portions of the metal patterns, which are damaged due to the above dry etching, the SiOB process, such as forming a solder plate, is subsequently progressed. The SiOB process generally includes V-groove forming process.

The following Table 1 compares capacitances measured between metal patterns in the conventional structure shown in FIG. 1 and the inventive structure shown in FIG. 3. It can be seen that the inventive structure decreases the capacitance for about 94–97% compared to the conventional structure. As shown in the table below, the invention can effectively reduce the capacitance without changing the area or structure of the metal patterns.

TABLE 1

Figure 2:
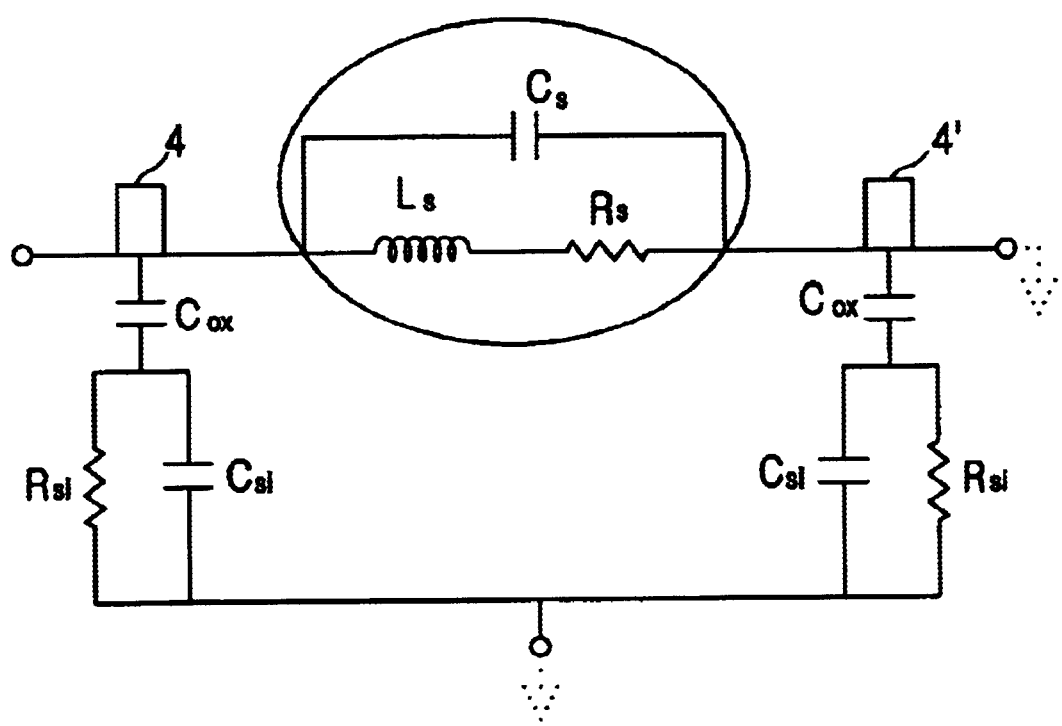
FIG. 2 is an equivalent circuit diagram of FIG. 1.

|  | Capacitance Between Metal Patterns on 1000 Ω Si (pF) | Capacitance Between Patterns Metal on 10000 Ω Si (pF) |
| --- | --- | --- |
| FIG. 1 | 45 | 41 |
| FIG. 2 | 2.8 | 1.1 |
| Reduction Ratio of Capacitance (%) | 93.8 | 97.3 |

While the preferred embodiments of the present invention have been illustrated and described, it will be understood by those skilled in the art that various changes and modifications may be made and equivalents may be substituted for elements thereof without departing from the true scope of the present invention. In addition, many modifications may be made to adapt to a particular situation and the teaching of the present invention without departing from its central scope. Therefore, it is intended that the present invention not be limited to the particular embodiment disclosed as the best mode contemplated for carrying out the present invention, but that the present invention include all embodiments falling within the scope of the appended claims.

What is claimed is:

1. A method of manufacturing a multi-layer structure for reducing capacitance thereon, the method comprising the steps of:

(a) forming a dielectric layer on a silicon substrate;

(b) forming at least two metal patterns separate from each other on the dielectric layer; and (c) etching the dielectric layer and shallowly etching an upper layer of the silicon substrate between the metal patterns to a predetermined thickness.

2. The method of claim 1, wherein the dielectric layer is a $SiO_2$ layer.

3. The method of claim 1, wherein the dielectric layer is formed on the silicon substrate using a Plasma Enhanced Chemical Vapor Deposition (PECVD) technique.

4. The method of claim 1, wherein the dielectric layer is formed on the silicon substrate using a Low Pressure Chemical Vapor Deposition (LPCVD) technique.

5. The method of claim 1, wherein the dielectric layer is formed on the silicon substrate using a thermal oxidation deposition technique.

6. The method of claim 1, wherein the (b) step comprises the steps of:

performing a lift-off photolithography to form lift-off photo-sensitive patterns on the dielectric layer except for areas defining the metal patterns;

depositing a metal element over the silicon substrate; and removing the photosensitive patterns and the metal element deposited on the photosensitive patterns via a lift-off process to form the metal patterns.

7. The method of claim 1 wherein the step (c) comprises the step of:

dry-etching the dielectric layer and subsequently over-etching to remove the upper layer of the silicon substrate while using the metal patterns as an etching mask.

8. The method of claim 1 wherein the etched-out portions of the silicon substrate between the metal patterns have a thickness of 0.5–2 $\mu$m.

* * * * *